US008757250B2

(12) United States Patent
Stuckey

(10) Patent No.: US 8,757,250 B2
(45) Date of Patent: Jun. 24, 2014

(54) ADVANCED THERMAL CONTROL INTERFACE

(75) Inventor: Larry Stuckey, San-Diego, CA (US)

(73) Assignee: Advantest Corporation, Tokyo (JP)

( * ) Notice: Subject to any disclaimer, the term of this patent is extended or adjusted under 35 U.S.C. 154(b) by 1066 days.

(21) Appl. No.: 12/278,843

(22) PCT Filed: Sep. 14, 2007

(86) PCT No.: PCT/US2007/078512
§ 371 (c)(1),
(2), (4) Date: Oct. 9, 2008

(87) PCT Pub. No.: WO2009/035459
PCT Pub. Date: Mar. 19, 2009

(65) Prior Publication Data
US 2010/0163217 A1 Jul. 1, 2010

(51) Int. Cl.
*F28F 27/00* (2006.01)
*F28D 11/06* (2006.01)
*F28D 11/00* (2006.01)
*G01K 7/00* (2006.01)

(52) U.S. Cl.
USPC ............... 165/276; 165/84; 165/86; 374/178

(58) Field of Classification Search
USPC ................ 165/84, 86, 276, 277; 324/750.03, 324/750.04; 374/141, 143, 29, 5, 43, 179, 374/135, 147, 148
See application file for complete search history.

(56) References Cited

U.S. PATENT DOCUMENTS

| 3,463,224 | A | * | 8/1969 | Myers ........................... 165/276 |
| 3,556,205 | A | * | 1/1971 | Harwood, Jr. .................. 165/46 |
| 3,563,307 | A | * | 2/1971 | Pain et al. ...................... 165/86 |
| 4,676,300 | A | * | 6/1987 | Miyazaki ....................... 165/276 |
| 4,759,403 | A | * | 7/1988 | Flint et al. ..................... 165/80.4 |
| 4,910,642 | A | * | 3/1990 | Downing ....................... 361/690 |
| 4,951,740 | A | * | 8/1990 | Peterson et al. ............. 165/276 |
| 5,050,037 | A | * | 9/1991 | Yamamoto et al. ........... 361/699 |
| 5,088,980 | A |   | 2/1992 | Leighton |
| 5,124,557 | A |   | 6/1992 | Aitken |
| 5,365,400 | A | * | 11/1994 | Ashiwake et al. ............. 361/752 |
| 5,394,299 | A | * | 2/1995 | Chu et al. ...................... 361/705 |
| 5,420,753 | A | * | 5/1995 | Akamatsu et al. ............ 361/719 |
| 5,704,416 | A | * | 1/1998 | Larson et al. ............. 165/104.33 |
| 5,977,785 | A | * | 11/1999 | Burward-Hoy .......... 324/750.09 |

(Continued)

FOREIGN PATENT DOCUMENTS

JP  2002-5990    1/2002
JP  2004-527764  9/2004

OTHER PUBLICATIONS

Japan Office action, mail date is Feb. 19, 2013.

*Primary Examiner* — Allana Lewin
*Assistant Examiner* — Travis Ruby
(74) *Attorney, Agent, or Firm* — Greenblum & Bernstein, P.L.C.

(57) ABSTRACT

An apparatus for controlling a temperature of a device. The apparatus includes a body (500) having a plurality of chambers (630) spaced substantially symmetrically about an axis of the body (500), wherein each of the plurality of chambers (630) comprises an upper diaphragm (635) and a lower diaphragm (640). The apparatus also includes a heat transfer element (515) attached to the body (500) via the plurality of chambers (630) such that the plurality of chambers (630) is in fluid communication with the heat transfer element (515).

6 Claims, 15 Drawing Sheets

(56) References Cited

U.S. PATENT DOCUMENTS

| | | | |
|---|---|---|---|
| 6,173,760 B1 * | 1/2001 | Gardell et al. | 165/80.4 |
| 6,268,995 B1 * | 7/2001 | Beuerman et al. | 361/277 |
| 6,616,999 B1 * | 9/2003 | Freuler et al. | 428/40.1 |
| 6,817,969 B2 | 11/2004 | Hermodsson et al. | |
| 6,972,056 B1 | 12/2005 | Delzeit et al. | |
| 7,055,586 B2 | 6/2006 | Sakakibara et al. | |
| 7,100,389 B1 * | 9/2006 | Wayburn et al. | 62/259.2 |
| 7,258,160 B2 | 8/2007 | Hashimoto | |
| 7,411,792 B2 * | 8/2008 | Richards et al. | 361/704 |
| 7,605,581 B2 * | 10/2009 | Taylor et al. | 324/750.09 |
| 7,732,918 B2 * | 6/2010 | Dangelo et al. | 257/722 |
| 7,743,763 B2 * | 6/2010 | Grip et al. | 126/569 |
| 7,870,800 B2 * | 1/2011 | Di Stefano et al. | 73/866.5 |
| 2001/0054893 A1 | 12/2001 | Yamashita et al. | |
| 2002/0134542 A1 * | 9/2002 | Unsworth | 165/277 |
| 2004/0052052 A1 * | 3/2004 | Rivera | 361/700 |
| 2004/0139756 A1 | 7/2004 | Wall et al. | |
| 2004/0194944 A1 | 10/2004 | Hendricks et al. | |
| 2005/0103040 A1 * | 5/2005 | Krempel | 62/383 |
| 2005/0252637 A1 * | 11/2005 | Leu et al. | 165/80.2 |
| 2006/0043649 A1 | 3/2006 | Ren et al. | |
| 2006/0141308 A1 * | 6/2006 | Becerra et al. | 429/24 |
| 2008/0042667 A1 | 2/2008 | Yamashita et al. | |
| 2008/0223555 A1 * | 9/2008 | Di Stefano | 165/101 |
| 2010/0224352 A1 * | 9/2010 | Stuckey et al. | 165/185 |
| 2011/0198059 A1 * | 8/2011 | Gavillet et al. | 165/104.26 |

* cited by examiner

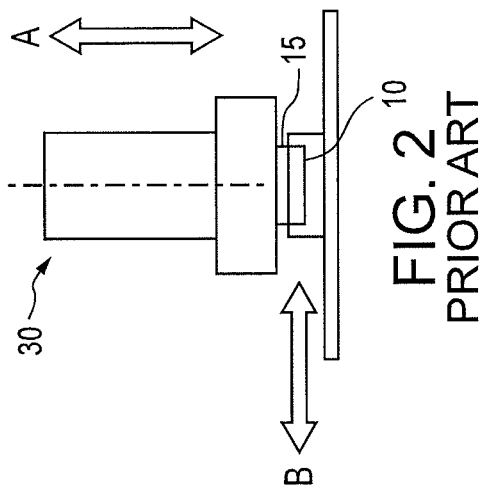
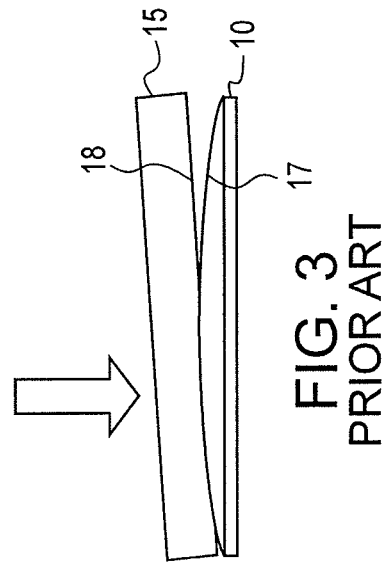
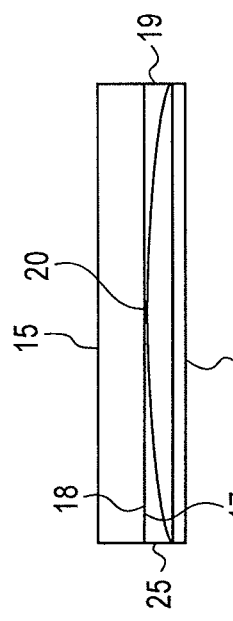
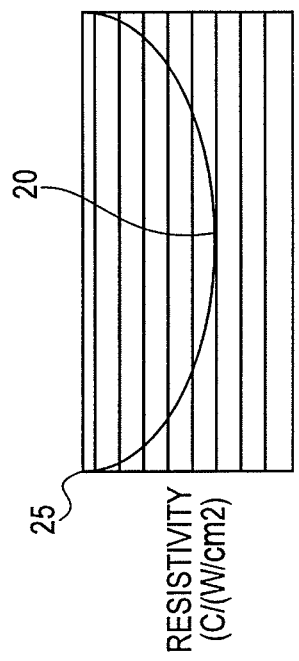
FIG. 1A PRIOR ART
FIG. 1B PRIOR ART
FIG. 2 PRIOR ART
FIG. 3 PRIOR ART

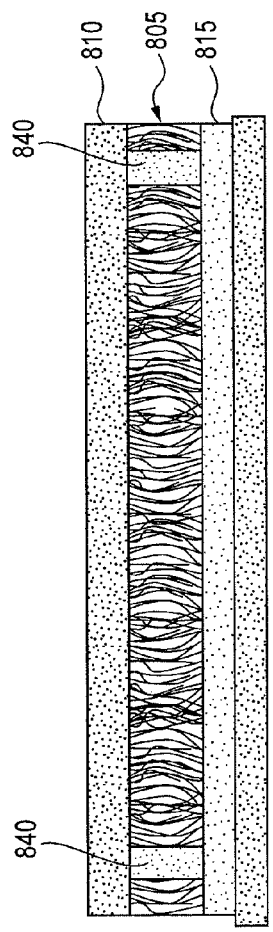
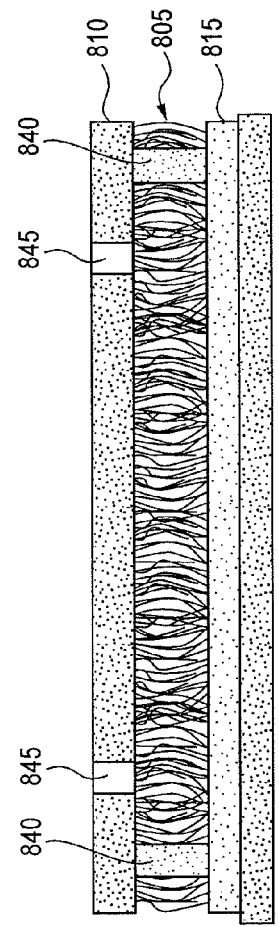

ADVANCED THERMAL CONTROL INTERFACE

BACKGROUND

1. Field of the Disclosure

The present disclosure relates to the field of temperature control, and more particularly, to providing an interface for maintaining a set point temperature through heating and/or cooling an electronic device or component, typically while the electronic device or component is under test.

2. Background Information

Solid state electronic devices or components, such as semiconductors, have varying performance characteristics based on temperature. Typically, for example, such electronic devices generate heat (i.e., self-heat) during operation, and thus as the internal temperature increases, the performance characteristics change. Also, solid state electronic devices may be used in different environments, possibly enduring a wide range of temperatures.

To ensure constant performance characteristics, it is desirable to maintain a relatively constant temperature of electronic devices. This is especially true when functionally testing electronic devices to ensure proper operation and compliance with design specifications. For example, an electronic device, referred to as a device under test (DUT), may undergo endurance procedures, such as short-circuit testing and burn-in testing, to observe various device characteristics. During such testing, the temperature of the DUT must be kept relatively constant at a predetermined test temperature, or set point temperature, in order for the results to be meaningful. In other words, the tester must be able to confirm that certain observed electrical characteristics are attributable to factors other than changing temperatures.

In order to maintain a constant temperature, known thermal control devices are cable of removing heat, e.g., through a heat sink, as well as adding heat, e.g., through an electric heater. A heat sink incorporates a fluid having a temperature much lower than the test temperature of the DUT. A heater is placed between the DUT and the heat sink, and power is applied to the heater to raise the temperature of the heater face, e.g., to the test temperature required for DUT testing. The heat sink offsets any excess heating, and also removes heat generated by the DUT during the testing process, to the extent this self-heating increases the device temperature beyond the test temperature. Power fluctuations may cause significant and relatively instantaneous self-heating, requiring the need for the thermal controller to quickly and accurately react to offset the unwanted increase in temperature.

The interface where the heat sink (or heater, if used) contacts the DUT is of particular importance for maintaining the DUT at a constant temperature. For example, when the surface of the heat sink (or heater) is not substantially co-planar with the surface of the DUT, there may exist a non-uniform heat transfer across the surface of the DUT, which results in undesirable thermal gradients at the DUT. To account for this, some conventional systems provide a thermal interface material between the surfaces of the heat sink (or heater) and the DUT. For example, a liquid (e.g., a mixture of water and alcohol) may be disposed between the heat sink (or heater) and the DUT. The liquid fills any air gaps between the heat sink (or heater) and DUT, thereby providing a more uniform thermal connection between the heat sink (or heater).

However, the use of liquids as thermal interface materials comes with other disadvantages. For example, device testing is often performed over a wide range of temperatures and pressures, including some below the freezing temperature of conventional thermal interface liquids. When a liquid between the heat sink (or heater) and DUT freezes, the thermal uniformity of the interface often becomes compromised, leading to undesired thermal gradients at the DUT. Moreover, the use of liquid as a thermal interface material also presents disadvantages at higher test temperatures. For example, at some testing conditions, the liquid thermal interface material converts portions of the surface of a ceramic heat sink (or heater) into a microscopic slurry, which then causes unwanted abrasion of the DUT.

Also, even though liquid is useful for filling air gaps between the heat sink (or heater) and the DUT, liquids do not eliminate thermal gradients altogether. This is because different thicknesses of liquid between the heat sink (or heater) and the DUT, which may occur at a microscopic level where the surfaces of the interface are not substantially co-planar, have different thermal resistivities. For example, as depicted in FIG. 1A, a DUT 10 and/or a heat sink (or heater) 15 may have non-planar surfaces 17, 18, which results in differing thickness of liquid 19 at the interface. The thickness of the liquid 19 may be, e.g., 0 μm at a first location 20 and, e.g., 50 μm at a second location 25. Because the thermal resistivity of the liquid changes with the thickness of the liquid, thermal gradients exist when power is applied to the DUT, as shown in FIG. 1B.

In addition to the material between the heat sink (or heater) and the DUT, the interface between the heat sink (or heater) 15 and the DUT 10 may also be affected by the structures to which the heat sink (or heater) 15 and/or the DUT 10 are attached. For example, the heat sink (or heater) 15 is commonly carried by a thermal controller 30, such as that shown in FIG. 2. The thermal controller 30 may comprise, for example, piping that carries different temperature fluids (e.g., heating and cooling water) to the heat sink 15 for maintaining the DUT 10 at the desired temperature. The thermal controller 30, including the heat sink (or heater) 15 and piping, is generally moveable in an axial direction normal to the DUT 10 (in the direction of arrow "A"). In this manner, plural DUT's may be moved past the thermal controller 30 (in the direction of arrow "B"), and the thermal controller 30 brought down into contact with each successive DUT 10 for testing.

However, the rigidity of the structure carrying the heat sink (or heater) 15 often causes the surfaces of the heat sink (or heater) 15 and DUT 10 to be out of alignment. That is to say, the rigidity of the thermal controller 30 makes it difficult to align the surfaces 17, 18 as substantially co-planar at the interface. Such a situation is depicted in FIG. 3, in which it is seen that the surface 18 of the heat sink (or heater) 15 is angled compared to the surface 17 of the DUT 10, such that the surfaces 17, 18 are not substantially co-planar at the interface. In such situations, not only is there a likelihood of a thermal gradient at the interface, but there may also be an uneven force (e.g., torque, moment, etc.) applied to the DUT 10. Particularly, when the testing of the DUT 10 requires an axial force (e.g., up to 100 pounds) be applied to the DUT 10, such uneven application of force due to non-co-planar surfaces can result in damage (e.g., cracking) to the heat sink (or heater) and/or DUT.

Accordingly, there exists a need in the art to overcome the deficiencies and limitations described hereinabove.

SUMMARY OF THE INVENTION

According to a first aspect of the invention, there is an apparatus for controlling a temperature of a device. The apparatus includes a body comprising a plurality of chambers spaced substantially symmetrically about a longitudinal axis of the body, wherein each of the plurality of chambers comprises an upper diaphragm and a lower diaphragm. The apparatus also includes a heat transfer element attached to the body via the plurality of chambers such that the plurality of chambers is in fluid communication with the heat transfer element.

In implementations, a temperature of the heat transfer element compensates for changes in the temperature of the device and substantially maintains a set point temperature of the device. The device comprises a semiconductor device. Moreover, the heat transfer element may be moveable relative to the device. For example, the heat transfer element may be moveable in six degrees of freedom relative to the device. Additionally, the heat transfer element may be axially moveable relative to the body. Furthermore, the heat transfer element may apply a force to the device, which force may be substantially perpendicular to an interface surface of the device.

In an embodiment, the body comprises a pneumatic manifold connected to an upper portion of each of the plurality of chambers. The pneumatic manifold may be in fluid communication with an external pressure or vacuum source. In this manner, the heat transfer element is moved axially away from the body when a positive pressure is supplied to the upper portion of each of the plurality of chambers. Conversely, the heat transfer element is moved axially toward the body when a vacuum is supplied to the upper portion of each of the plurality of chambers. Moreover, the heat transfer element applies a force to the device when a positive pressure is supplied to the upper portion of each of the plurality of chambers.

In another embodiment, all of the upper diaphragms extend generally coplanar to each other, all of the lower diaphragms extend generally coplanar with each other, and all of the upper diaphragms and lower diaphragms may extend in a direction generally orthogonal to the longitudinal axis of the body. Also, the upper diaphragms may extend generally coplanar to each other and along an upper diaphragm plane, the lower diaphragms may extend generally coplanar to each other and along a lower diaphragm plane, and the upper diaphragm plane and the lower diaphragm plane may be generally parallel to each other. Moreover, the upper diaphragm and the lower diaphragm of a respective one of the plurality of chambers may have a common central axis.

In an even further embodiment, each said upper diaphragm and each said lower diaphragm comprises a rolling diaphragm, such as, for example, a rolling diaphragm that is substantially devoid of static friction. Also, a unitary upper diaphragm member may integrally comprise each respective said upper diaphragm. The unitary upper diaphragm member may be sandwiched between a pneumatic manifold and a fluid manifold of the body.

In an additional embodiment, each of the plurality of chambers further comprises: an upper chamber portion arranged above the upper diaphragm; a middle chamber portion arranged between the upper diaphragm and the lower diaphragm; and a lower chamber portion arranged below the lower diaphragm. The upper chamber portion is operatively connected to a pneumatic pressure source. The middle chamber portion defines a fluid pathway between a fluid manifold of the body and the heat transfer element. A valve may be arranged in the fluid pathway between the middle chamber portion and the heat transfer element.

Moreover, at least the heat transfer element may be selectively removable from the base. For example, the heat transfer element may be selectively removable via one of friction fit, snap fit, and quick disconnect. Also, the apparatus may comprise a thermal interface material disposed between, and contacting, the heat transfer element and the device. The thermal interface material may comprise, for example, carbon nano tubes.

According to a second aspect of the invention, there is an apparatus for controlling a temperature of a device. The apparatus includes a substrate and nano tubes connected to the substrate, wherein the nano tubes are structured and arranged to create a thermal interface between the substrate and the device. The device may comprise a semiconductor device. Furthermore, the nano tubes comprise carbon nano tubes having a height in a range of 25 µm to 150 µm and a substantially consistent thermal resistivity between 15 psi and 75 psi.

Moreover, the substrate may comprise a heat transfer element of a thermal controller that is structured and arranged to compensate for changes in the temperature of the device and substantially maintain a set point temperature of the device.

In an alternative embodiment, the substrate is attached to a heat transfer element via re-workable thermal solder or thermal grease, and the heat transfer element is comprised in a thermal controller that is structured and arranged to compensate for changes in a temperature of the device and substantially maintain a set point temperature of the device.

In an even further embodiment, the apparatus additionally comprises at least one hard stop connected to the substrate. The at least one hard stop is structured and arranged to transmit an axial force to the device. Also, a length of the at least one hard stop is less than a length of the nano tubes. Additionally, the apparatus may further comprise at least one vacuum channel disposed through the substrate, such that the at least one hard stop, the at least one vacuum channel, and the substrate form a vacuum cup at the device. In a further embodiment, the nano tubes are grown directly on a substrate, which may comprise a copper surface of a heat sink. In an even further embodiment, a substrate comprises a first side and a second side. A first plurality of nano tubes are connected to the first side, and a second plurality of nano tubes are connected to the second side. Moreover, the substrate may comprise foil.

According to a third aspect of the invention, there is an apparatus for controlling a temperature of a device. The apparatus includes a body comprising a plurality of chambers spaced substantially symmetrically about an axis of the body, wherein each of the plurality of chambers comprises an upper diaphragm and a lower diaphragm. The apparatus also includes a heat transfer element attached to the body via the plurality of chambers such that the plurality of chambers is in fluid communication with the heat transfer element, a substrate connected to the heat transfer element, and nano tubes connected to the substrate. The nano tubes are structured and arranged to create a thermal interface between the heat transfer element and the device, and a temperature of the heat transfer element compensates for changes in the temperature of the device and substantially maintains a set point temperature of the device.

BRIEF DESCRIPTION OF THE DRAWINGS

The present disclosure provides the detailed description that follows by reference to the noted drawings by way of non-limiting examples, in which like reference numerals represent similar parts throughout several views of the drawings, and in which:

FIG. 1A shows an exemplary interface according to the prior art;

FIG. 1B shows an exemplary thermal resistivity at the interface of FIG. 1A;

FIG. 2 shows an exemplary thermal controller and device under test according to the prior art;

FIG. 3 shows another exemplary interface according to the prior art;

FIG. 18 shows another exemplary implementation of the thermal interface material according to aspects of the invention;

FIG. 19 shows another exemplary implementation of the thermal interface material according to aspects of the invention.

DETAILED DESCRIPTION

The present disclosure relates to an apparatus and method for providing an advanced interface between a thermal controller and an electronic device, such as a solid state electronic device being tested in a controlled environment, referred to as a device under test (DUT). In an embodiment, a heat sink is operatively connected to a thermal chuck by a zero influence pusher via a free-floating gimbal attachment. The zero influence pusher provides the capability to extend and retract the heat sink into and out of contact with a DUT, without applying an uneven force (e.g., torque, moment, etc.) to the DUT. In a preferred embodiment, at least the heat sink is removably attached to the thermal chuck. In an even further embodiment, a thermal interface material comprising nano tubes is provided. By using nano tubes, a substantially uniform thermal resistivity is provided at the interface, even when the interface comprises non-coplanar surfaces. As defined herein, "heat sink" means any heat transfer element or device (e.g., resistive heater, radiator, heat pipe, cross-flow heat exchanger, etc.) structured and arranged to transfer heat to and/or from an object which it is in thermal contact with.

Zero Influence Pusher

Figure 4:
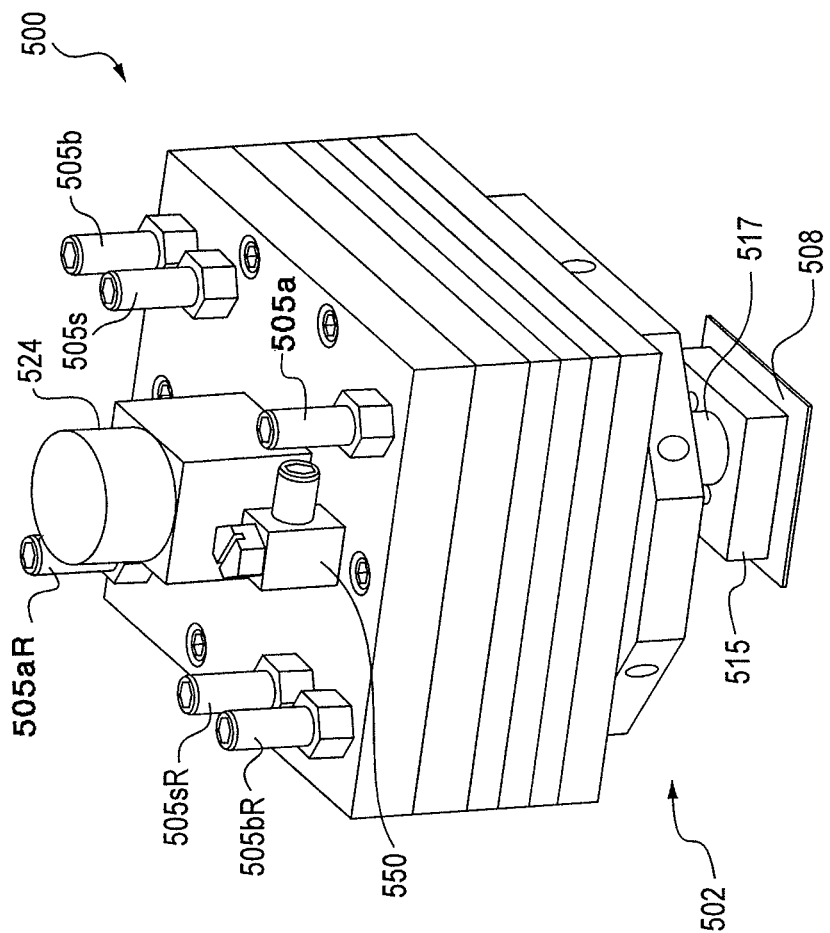
FIG. 4 shows an exemplary system according to aspects of the invention.

FIG. 4 shows a thermal controller and an associated zero influence pusher comprising a free-floating gimbal attachment for a heat sink, according to a first embodiment of the invention. The zero influence pusher may be used with any suitable thermal controller that is structured and arranged to facilitate bringing a heat sink into contact with a DUT. In an exemplary embodiment, the zero influence pusher is used with the thermal chuck described in Applicants' co-pending application PCT/US07/74727, the disclosure of which is hereby expressly incorporated by reference in its entirety.

More specifically, in the exemplary embodiment shown in FIG. 4, a zero influence pusher 502 operatively connected between a thermal chuck 500 and a heat sink 515. The zero influence pusher 502 allows the heat sink 515 to be brought into contact with a DUT (not shown) at a test site on substrate 508. A mixing chamber 517 is structured and arranged in selective fluid communication with various fluid ports 505$a$, 505$b$, 505$s$, 505$a$R, 505$b$R, 505$s$R, for maintaining the heat sink 515, and therefore the DUT, at a desired temperature. Valve 524 controls the fluid communication between heat sink 515 and fluid ports 505$a$, 505$b$, 505$s$, 505$a$R, 505$b$R, 505$s$R, as described in greater detail below. As used throughout the specification and claims, a "fluid" may be any non-solid material, including but not limited to a liquid, a gas, particulates, granules or any combination thereof.

Figure 5:
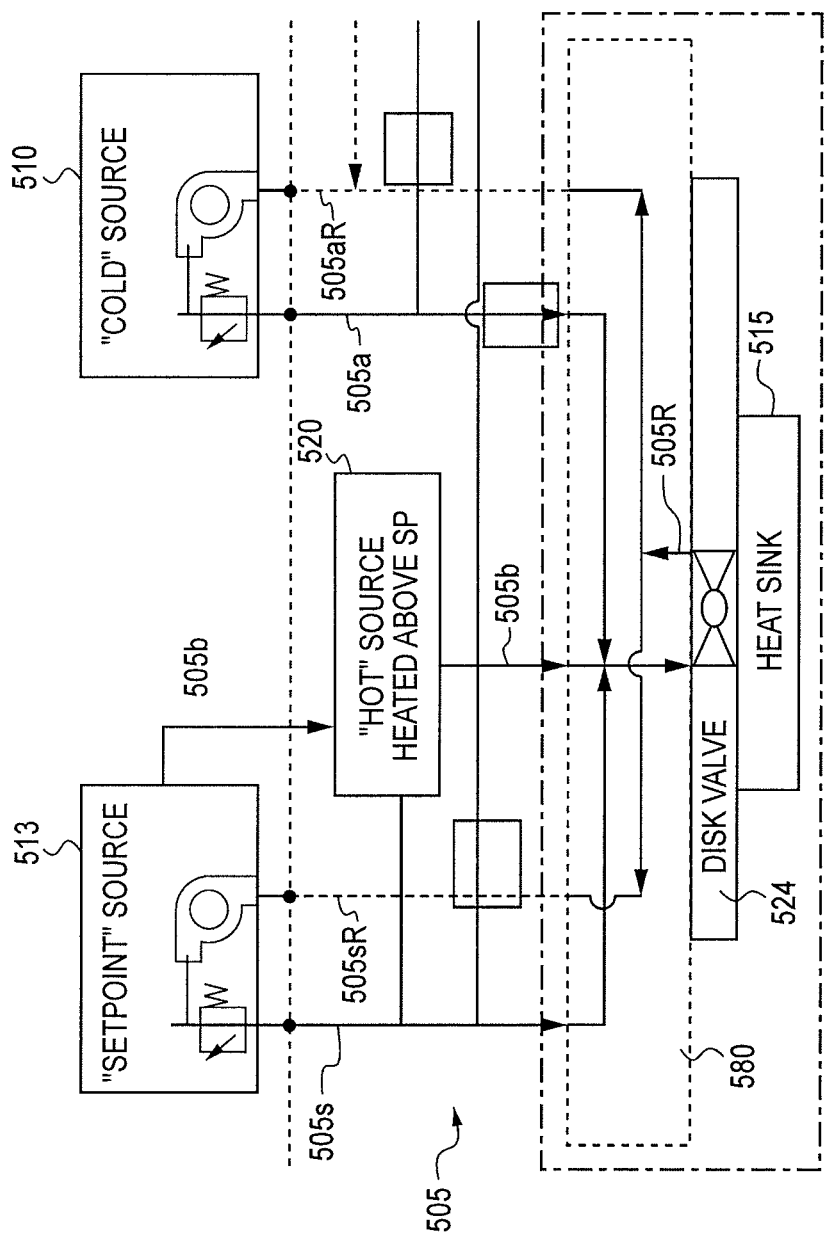
FIG. 5 shows a schematic view of an exemplary thermal chuck according to aspects of the invention.

FIG. 5 shows a schematic view of the exemplary thermal chuck 500 in accordance with a non-limiting embodiment of the invention, which utilizes three fluid sources (also referred to as reservoirs), namely a cold fluid source 510, a setpoint fluid source 513 and a hot fluid source 520. The fluid in the setpoint fluid source 513 is set at a temperature higher than the fluid in the cold fluid source 510. More specifically, the fluid in the setpoint fluid source 513 is set at a temperature that is generally the same as a setpoint temperature of a DUT (taking into consideration the thermal loss potentially occurring though the thermal chuck 500). For example, if the setpoint of the DUT is 80 degrees Celsius, the temperature of the fluid in the setpoint fluid source 513 may be set at, e.g., 85 degrees Celsius.

Further, the temperature of the fluid in the hot fluid source is set at a temperature higher than the fluid in the setpoint fluid source 513. For increased energy efficiency, the set point fluid temperature may be closer to the cold fluid temperature than it is to the hot fluid temperature. While FIG. 5 shows three fluid sources of three different temperatures 510, 513, 520, it is appreciated by those of skill in the art that more than three fluid sources of more than three different temperatures, or that one or more fluids having a single temperature, may be used in alternative embodiments. For example, should the system be configured to test three DUTs at three different setpoint temperatures, the system may include a cold fluid source, a first setpoint fluid source, a second setpoint fluid source, a third setpoint fluid source and a hot fluid source, totaling five different fluid sources containing respective fluids of five different temperatures.

As shown in FIG. 5, a conduit 505 interconnects the three fluid sources 510, 513, 520 to heat sink 515. Specifically, cold fluid passes though cold fluid conduit 505$a$ and is directed through the thermal chuck 500 via manifold 580, where the cold fluid communicates with a valve 524 (including but not limited to a disk valve). Further, setpoint fluid exits the setpoint source 513 to enter the hot fluid source 520 via conduit 505b. Once the setpoint fluid in the hot source 520 has reached a predetermined hot temperature, the hot fluid passes through conduit 505b and is directed through the thermal chuck 500 via manifold 580, where the hot fluid communicates with valve 524. Setpoint fluid not directed to the hot fluid source 520 passes through conduit 505s is directed through the thermal chuck 500 via manifold 580, where the setpoint fluid communicates with valve 524. During testing of the DUT, setpoint fluid may exclusively mix with cold fluid, for increased energy efficiency. In other words, eliminating the direct mixing of cold and hot fluid results in increased energy efficiency, since directly mixing cold and hot fluid results in significant energy consumption as well as increased chance of thermal gradients across the heat sink 515.

Figure 6:
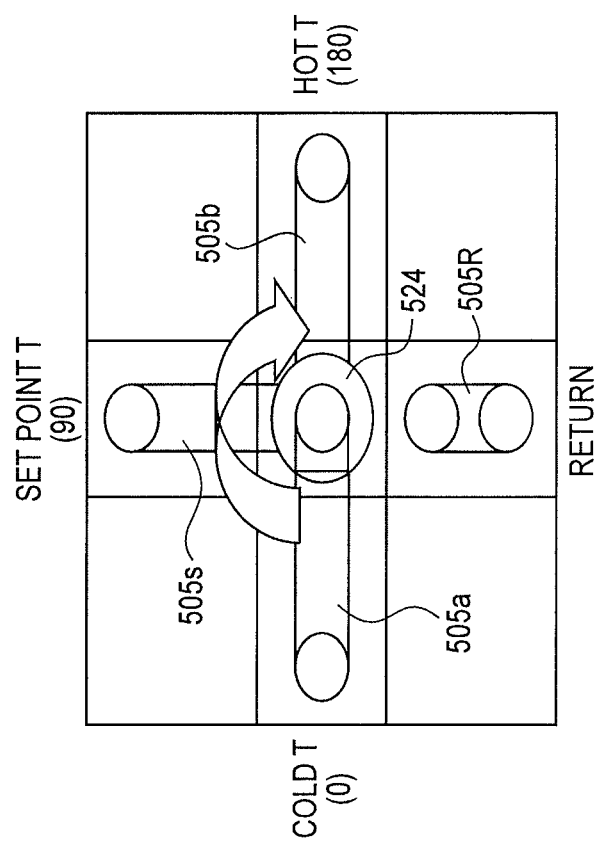
FIG. 6 shows an exemplary schematic view of a valve of a thermal controller according to aspects of the invention.

FIG. 6 schematically shows a disk valve 524 in communication with cold fluid conduit 505a, setpoint fluid conduit 505s and hot fluid conduit 505b. The valve 524 is preferably mounted immediately above the heat sink, and rotates either 180 or 360 degrees to discharge a desired mixture of cold fluid, setpoint fluid and hot fluid, such that combined fluid of a predetermined temperature may flow to the heat sink 515 (shown in FIG. 5). Specifically, in a non-limiting embodiment, when the valve 524 is at zero degrees of rotation, cold fluid is discharged; when the valve is at 90 degrees of rotation, setpoint fluid is discharged; when the valve is at 180 degrees of rotation, hot fluid is discharged; and when the valve is at 270 degrees of rotation, fluid that has already flowed to the heat sink 515 is returned via return conduit 505R (shown in FIG. 5), thereby enabling fluid to be discharged at a generally constant rate. In this way, the valve 524 is preferably located at the junction of the fluid supply conduits 505a, 505s and 505b. For optimal fast temperature response, it is preferable for the mixing of fluids to be at the inlet of the heat sink, to minimize fluid transit time. Also, with the above-described configuration, the heat sink 515 and mixing chamber 517 (shown in FIG. 4) only require a single inlet and a single outlet. Further, problems with incompressibility of the fluid are reduced due to the close proximity of the fluid mixing to the heat sink 515. Additionally, the above-described configuration reduces problems with repeatability and hysteresis. However, the invention is not limited to the above-described disk valve, and other suitable valves and/or regulators may be used with the invention.

Figure 7:
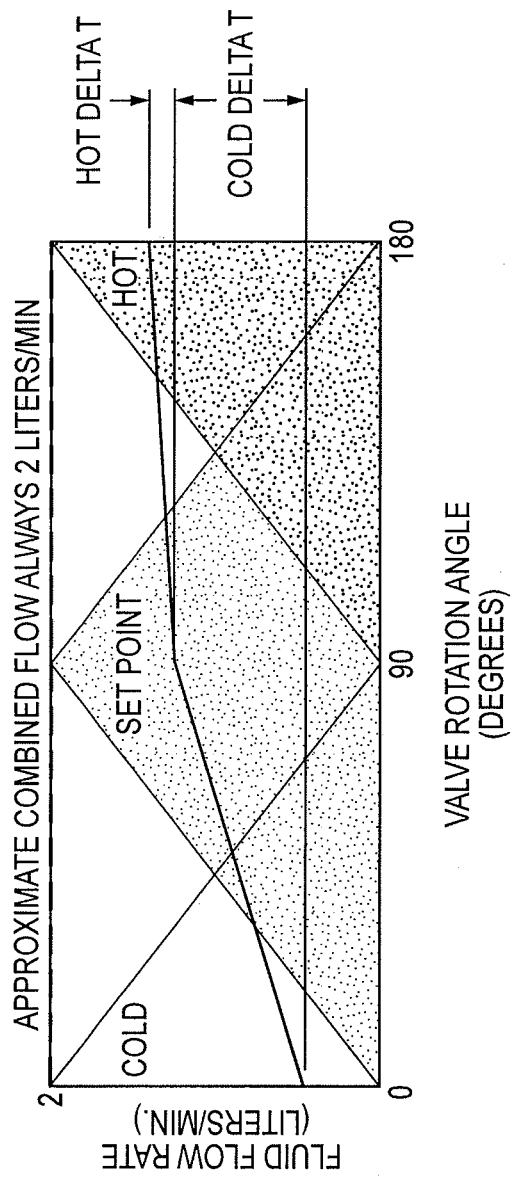
FIG. 7 shows a graph of the mixing of cold, setpoint and hot fluids according to aspects of the invention.

FIG. 7 is a graph showing the mixing of cold, setpoint and hot fluids in relation to the actuation of the valve 524. Specifically, FIG. 7 shows the combined flow of to be at a constant rate of approximately two liters per minute; however, those of skill in the art would appreciate that this rate can be greater than or less than two liters per minute and can be varied instead of constant. Moreover, while FIGS. 4-7 are described with respect to a three fluid system, it is understood that the invention is not limited to use with a three fluid system. For example, a single fluid may be used in which portions of the fluid having different respective temperatures are mixed in varying proportions within a heat sink to maintain and control the temperature of the DUT. Alternatively, at least two different fluids, having different respective temperatures, may be mixed in varying proportions within the heat sink to maintain and control the temperature of the DUT. Additionally, two or more different fluids in different states of matter may be used in the present invention. For example, a gaseous fluid may be mixed with a liquid fluid, in accordance with a non-limiting feature of the present invention. Moreover, the invention may be used with more than three fluids.

FIG. 5 shows that fluid from return conduit 505R is returned to the setpoint fluid source 513 via setpoint fluid return conduit 505sR and is also returned to the cold fluid source 510 via cold fluid return conduit 505aR. In other words, while three fluid supply conduits 505a, 505s, 505b are supplied to the thermal chuck, only two fluid return conduits 505aR, 505sR (or 505aR, 505bR; or 505sR, 505bR) may be supplied from the thermal chuck. However, FIG. 4 shows a schematic perspective view of the thermal chuck 500 having three fluid supply conduits 505a, 505s, 505b supplied to the thermal chuck, and three fluid return conduits 505aR, 505sR, 505bR supplied from the thermal chuck. Those of skill in the art would appreciate that in alternative embodiments, only one fluid return conduit may be supplied from the thermal chuck. Further, after the combined fluid flows to the heat sink 515, there is little temperature difference between the setpoint and hot fluids, so the setpoint fluid return conduit 505sR is located next to the hot fluid return conduit 505bR on the upper portion of the thermal chuck 500, thereby resulting in little thermal loss. Additionally, the aforementioned combined fluid return could be performed either internally or externally to the chuck 500.

Of course, it is understood that any method of transferring thermal energy from a fluid (i.e., for maintaining a cold delta T and a hot delta T) in order to maintain the temperature of the DUT may be incorporated herein without affecting the scope and spirit of the present invention. It is further understood that the fluids may have any number of different temperatures, or alternatively, the fluid may be a single temperature. For example, in an embodiment of the invention, the fluid flowing through the conduit 305 may be divided into three or more portions, each having a different delta T, which may be mixed in various proportions to achieve a desired mixed fluid portion temperature.

Figure 8:
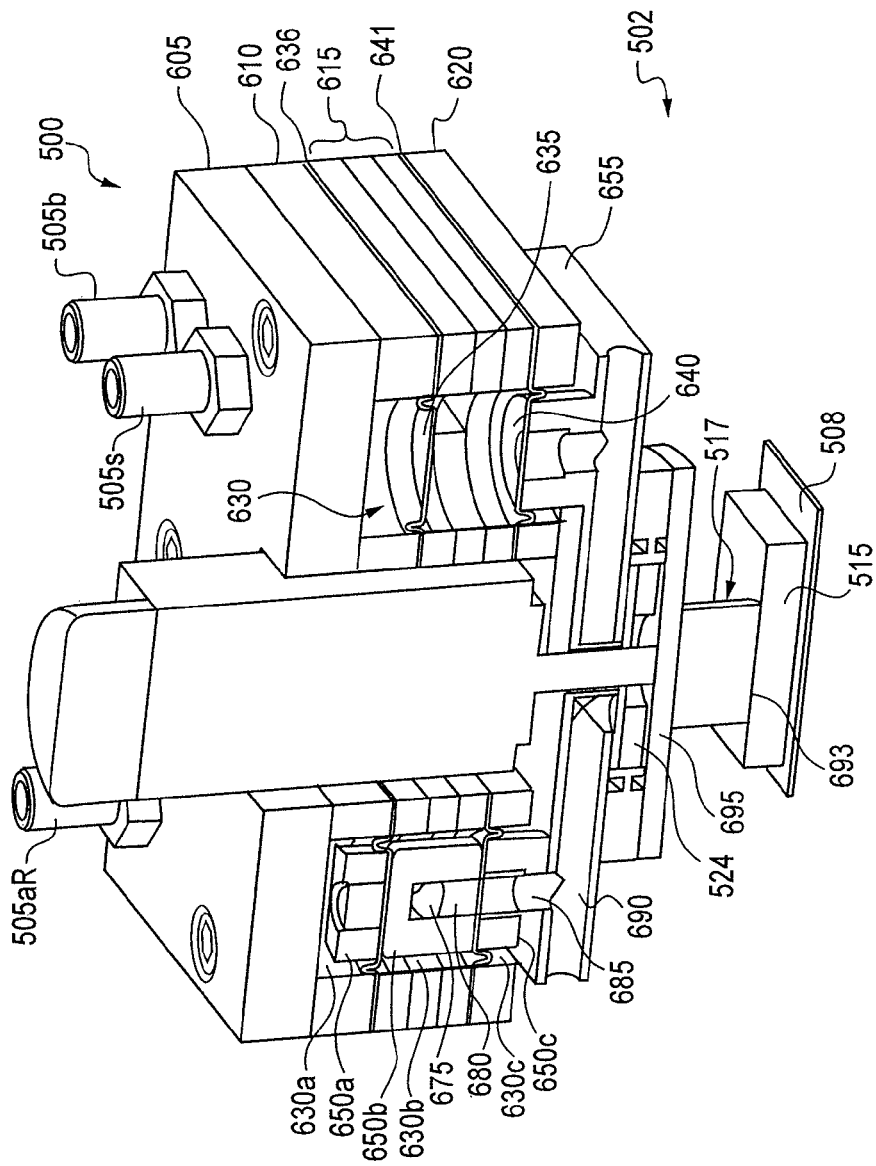
FIG. 8 shows a partial view of portions of the exemplary system shown in FIG. 4.

FIG. 8 shows a partial view of a system according to aspects of the invention. The system includes, inter alia, a thermal chuck 500, cold fluid return conduit 505aR, set fluid supply conduit 505s, hot fluid supply conduit 505b, valve 524, heat sink 515, mixing chamber 517, and substrate 508 (which may be similar to those elements described above with respect to FIGS. 4-7). Thermal chuck 500 includes an upper plate 605, pneumatic manifold 610, fluid manifold 615, and lower plate 620, each of which may be composed of any suitable material, such as, for example, metal, plastic, composite, etc. The upper plate 605 provides connection locations (e.g., threaded ports) for the fluid supply conduits 505a, 505s, 505b, fluid return conduits 505aR, 505sR, 505bR, and a pressure port 550 (described in greater detail below). The pneumatic manifold 610, fluid manifold 615, and lower plate 620 comprise axially aligned bores that combine to form six respective chambers 630 that are structured and arranged to operatively connect the thermal chuck 500 to the zero influence pusher 502. In the exemplary embodiment described with respect to FIGS. 8-11, six chambers 630 are shown substantially symmetrically disposed about coincident central axes of the thermal chuck 500 and zero influence pusher 502; however, any suitable number of chambers 630 (e.g., greater than or less than the six shown) may be used with the invention.

Disposed within each chamber 630, between the pneumatic manifold 610 and the fluid manifold 615, is an upper diaphragm 635. Also disposed within each chamber 630, between the fluid manifold 610 and the lower plate 620, is a lower diaphragm 640. The upper diaphragm 635 and lower diaphragm 640 divide each chamber 630 into an upper chamber portion 630a, a middle chamber portion 630b, and a lower chamber portion 630c. The upper diaphragm 635 provides a generally air-tight seal between the upper chamber portion 630a and the middle chamber portion 630b, while the lower diaphragm 640 includes a hole that allows fluid communication between the middle chamber portion 630b and the lower chamber portion 630c.

Figure 11:
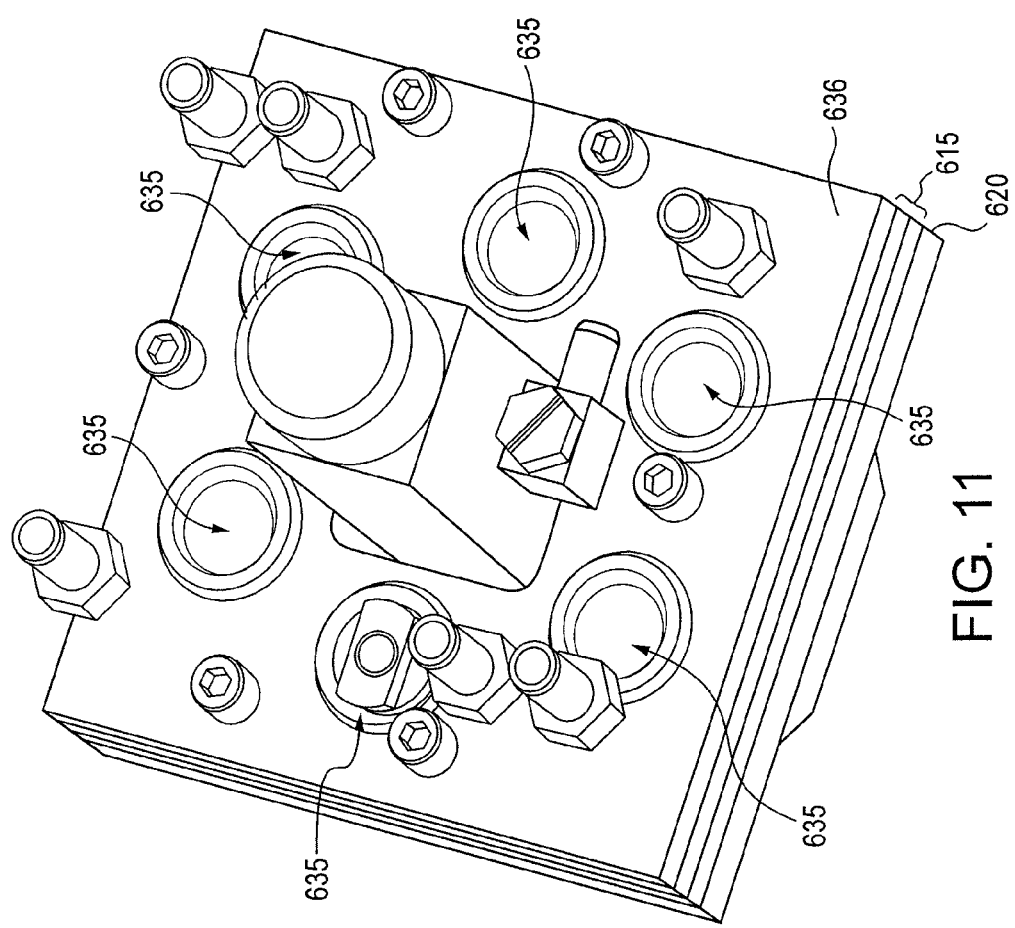
FIG. 11 shows another partial view of portions of the exemplary system shown in FIG. 4.

In embodiments, the upper diaphragm 635 and lower diaphragm 640 each comprise respective rolling diaphragms, such as that manufactured by Bellofram Corp., of Newell, W. Va.; although those of ordinary skill in the art will recognize that any suitable rolling diaphragm may be used with the invention. In a preferred implementation, a unitary upper diaphragm member 636 that integrally includes each respective upper diaphragm 635 may be sandwiched between the pneumatic manifold 610 and the fluid manifold 615, as shown in FIGS. 8 and 11. Similarly, a unitary lower diaphragm member 641 that integrally includes each respective lower diaphragm 640 may be sandwiched between the fluid manifold 615 and the lower plate 620.

Still referring to FIG. 8, an upper chamber element 650a is disposed within each upper chamber portion 630a; a middle chamber element 650b is disposed within each middle chamber portion 630b; and a lower chamber element 650c is disposed within each lower chamber portion 650c. The respective lower chamber elements 650c are connected to the zero influence pusher body 655. The upper diaphragm 635 and the lower diaphragm 640 are disposed in opposite orientations, which allows for axial displacement of the upper chamber element 650a, middle chamber element 650b, and lower chamber element 650c, in unison, along a central axis of the chamber 630. In this manner, the diaphragms 635, 640 and the chamber elements 650a, 650b, 650c, in each respective chamber 630 combine to form a floating attachment of the zero influence pusher 502 to the thermal chuck 500.

In embodiments, a central axis of the zero influence pusher 502 is substantially coincident with a central axis of the thermal chuck 500, and the respective floating attachments are arranged substantially symmetrically about these axes. As such, the floating attachments collectively form a free-floating gimbal connection between the thermal chuck 500 and the zero influence pusher 502. This free-floating gimbal connection provides the zero influence pusher 502 with six degree-of-freedom movement relative to the thermal chuck 500, as described in greater detail below.

Figure 9:
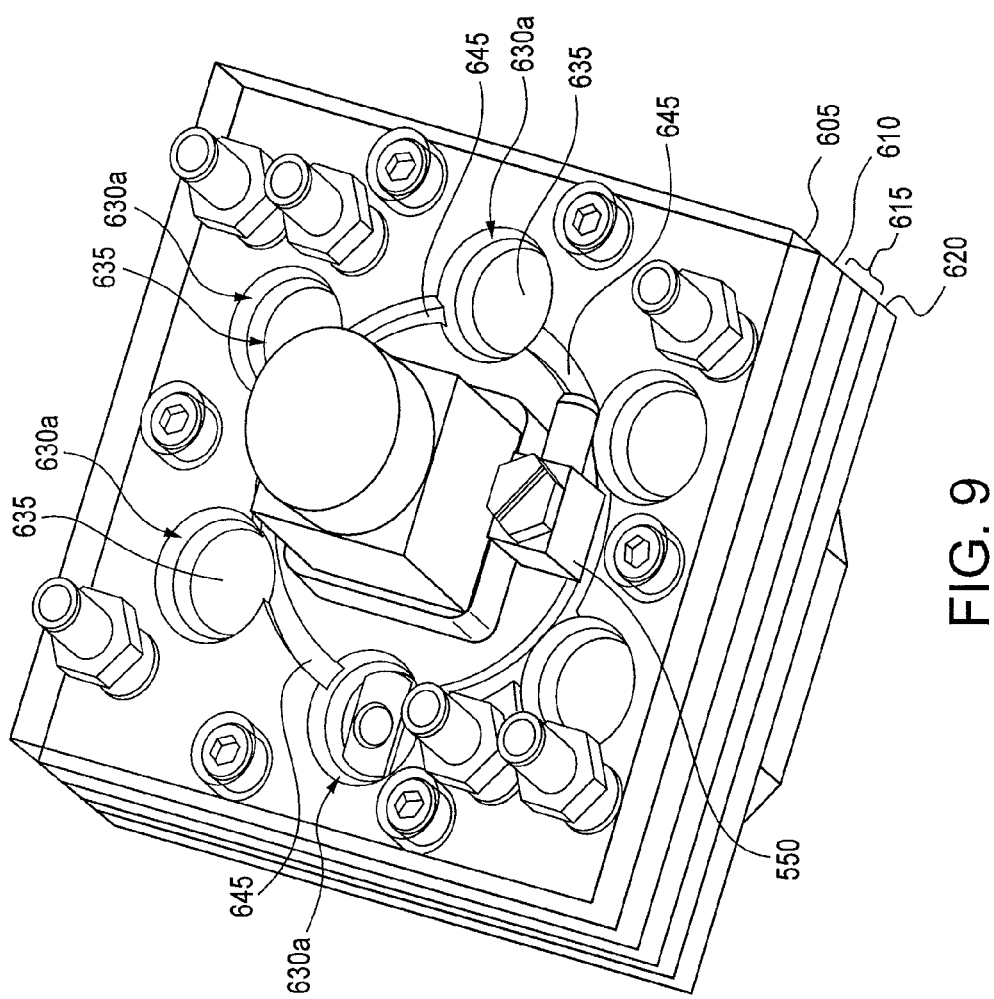
FIG. 9 shows another partial view of portions of the exemplary system shown in FIG. 4.

FIG. 9 shows the system of FIG. 8 with the upper plate 605 transparent so that the pneumatic manifold 610 is visible. As depicted in FIG. 9, each upper chamber portion 630a is in communication with pressure port 550 via pneumatic ports 645 formed in the pneumatic manifold 610. In this manner, the axial position of the zero influence pusher 502 may be controlled by adjusting the pneumatic pressure in the upper chamber portions 630a. In embodiments, the floating fluid attachments are biased toward a neutral position along the z-axis due to the opposed orientation of the upper diaphragm 635 and the lower diaphragm 640. By applying a positive pneumatic pressure to the respective upper chamber portions 630a, the zero influence pusher 502 may be moved axially downward (i.e., out of the thermal chuck 500 along the z-axis). Conversely, by applying a negative pressure (e.g., a vacuum) to the upper chamber portions 630a, the zero influence pusher 502 may be moved axially upward (i.e., into the thermal chuck 500 along the z-axis). In a preferred embodiment, the zero influence pusher 502 may travel 1 mm in each direction from the neutral position, for a total of 2 mm of travel in the z-axis direction. However, the invention is not limited to this amount of travel, and the respective components may be designed (e.g., sized) to provide any suitable amount of travel in the z-axis direction.

The travel of the zero influence pusher 502 in the z-axis direction allows the heat sink 515 to be controllably axially moved until it comes into contact the substrate 508 that holds the DUT. As used herein, "axially" refers to a direction generally parallel to the coincident axis of the zero influence pusher 502 and the thermal chuck 500. Owing to the free-floating connection between the thermal chuck 500 and the zero influence pusher 502 provided by the diaphragms 635, 640, a point of contact between the heat sink and the DUT becomes a center of rotation for the gimbal connection between the thermal chuck 500 and the zero influence pusher 502. In this manner, the interface surface of the heat sink 515 may be pivoted or rotated, if necessary, to come into a substantially co-planar relationship with the interface surface of the DUT. Moreover, because the center of rotation of the free-floating gimbal connection (and, therefore, of the heat sink 515) is a contact point between the heat sink 515 and the DUT, any rotation of the heat sink 515 is accomplished without accompanying translation of the heat sink 515 relative to the DUT (e.g., when the heat sink is moving and the DUT is stationary). Accordingly, the heat sink 515 and DUT are brought into a substantially co-planar interface without any undesirable scrubbing (e.g., abrading) of the surface of the DUT by the heat sink 515.

Moreover, because the respective chambers 630 are disposed substantially symmetrically about the central axis of the thermal chuck 500 and zero influence pusher 502, and because each upper chamber portion 630 sees the same pneumatic pressure (positive or negative), any force applied to the DUT by the heat sink 515 is substantially perpendicular to the surface of the DUT. That is to say, implementations of the invention avoid applying unwanted torque to the DUT. Even further, because the upper diaphragm 635 and lower diaphragm 640 both comprise rolling diaphragms that are substantially free of static friction, axial force is applied evenly to the zero influence pusher 502, and therefore to the DUT. In this manner, jerk (i.e., a sudden change in acceleration when initially overcoming static friction) is substantially eliminated, and the possibility of jerk-induced damage to the heat sink 515 and/or DUT is minimized.

Figure 10:
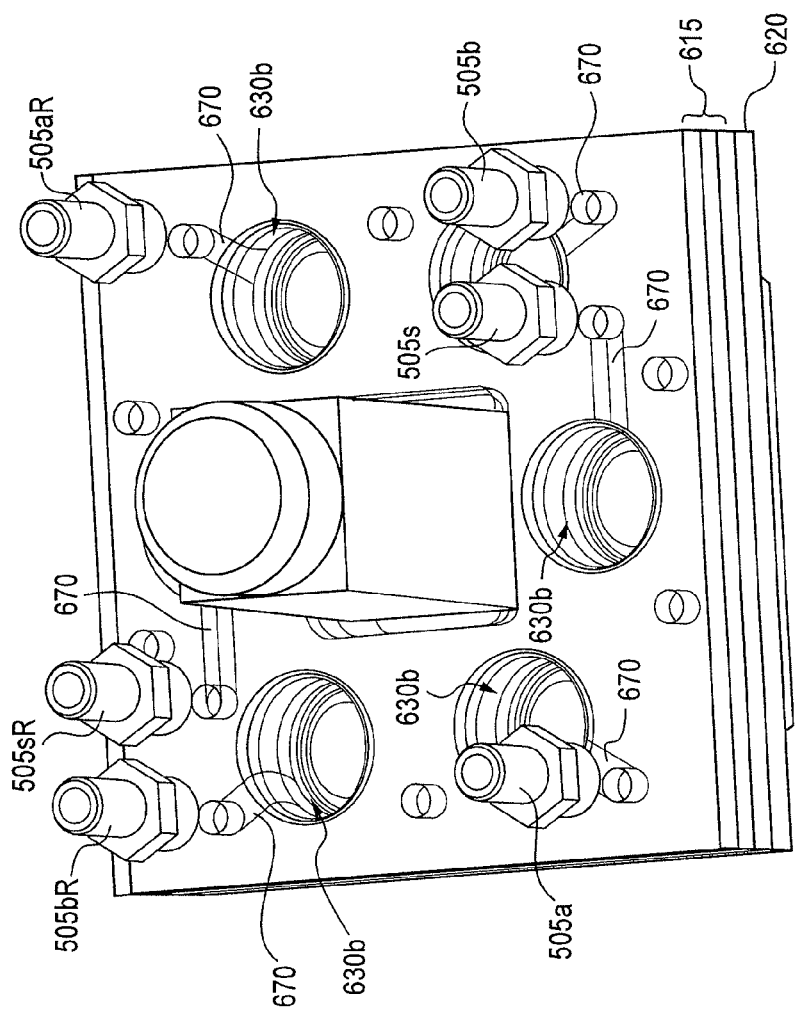
FIG. 10 shows another partial view of portions of the exemplary system shown in FIG. 4.

FIG. 10 shows the exemplary system of FIG. 8 with the top plate 605, pneumatic manifold 610, and unitary upper diaphragm member 636 removed. As depicted in FIG. 10, each middle chamber portion 630b is in fluid communication with a respective fluid conduit (e.g., 505a, 505s, 505b, 505aR, 505sR, 505bR) via cross ports 670 formed in the fluid manifold 615. Also in FIG. 10, the upper chamber element 650a and middle chamber element 650b are not shown, such that the lower diaphragms 640 are visible in the chambers 630.

Referring back to FIG. 8, each middle chamber element 650b includes a cross bore 675 that intersects with an axial bore 680. The cross bore 675 is in fluid communication with the middle chamber portion 630b, and the axial bore 680 is in fluid communication with a through bore 685 of the lower chamber element 650c via a hole in the lower diaphragm 640. Even further, each through bore 685 is in fluid communication with a respective fluid channel 690 of the zero influence pusher body 655, whereby each fluid channel 690 leads to the valve 524. In this manner, controlled movement of the valve 524 selectively provides fluid communication between the fluid supply conduits 505a, 505s, 505b and an inlet duct 693 of the mixing chamber 517, and between an outlet duct 695 of the mixing chamber 517 and the fluid return conduits 505aR, 505sR, 505bR. As such, the heat sink 515, and therefore the DUT, can be maintained at a desired temperature (as described above with respect to FIGS. 4-7). For example, the system as described may be used for set point temperatures (e.g., DUT test temperatures) ranging from approximately −80° C. to approximately 200° C. However, it is noted that the invention is not limited to use in this temperature range, and that the system may be designed for use at any suitable temperature.

In implementations, pressure fluctuations may occur in the respective fluid conduits (e.g., 505a, 505s, 505b, 505aR, 505sR, 505bR) during operation of the system. For example, a supply conduit may momentarily have a higher fluid pressure than a return conduit, and vice versa. However, since the all of the fluid (whether supply or return) enters the respective chambers 630 between the upper and lower diaphragms 635, 640, each diaphragm 635, 640 of a chamber 630 sees the same (i.e., offsetting) pressure, such that there is no axial force induced to the zero influence pusher 502 by the fluid supply, thereby helping minimize unwanted uneven force (e.g., torque) on the heat sink and/or DUT.

FIG. 11 shows the exemplary system of FIG. 8 with the top plate 605 removed, such that the unitary upper diaphragm member 636 is visible. While the invention has been described with respect to a unitary upper diaphragm member 636 that collectively embodies the plural diaphragms 635, it is noted that the invention is not limited to this exemplary embodiment. For example, separate diaphragms 635, which are not connected by a unitary upper diaphragm member 636, may be disposed in each respective chamber 630.

In a preferred embodiment, the mixing chamber 517 (including inlet duct 693 and outlet duct 695) and the heat sink 515 are selectively removable as a unit from the zero influence pusher body 655. For example, the mixing chamber 517 may be attached to the zero influence pusher body 655 by a selectively disengageable connection, including but not limited to a friction fit, snap fit, quick-disconnect, or any other suitable connection. In this manner, different heat sinks 515 (having, for example, different thermal interface areas and/or different thermal interface materials) can be quickly and easily adapted to the system for use in testing different types of DUTs.

Figure 12:
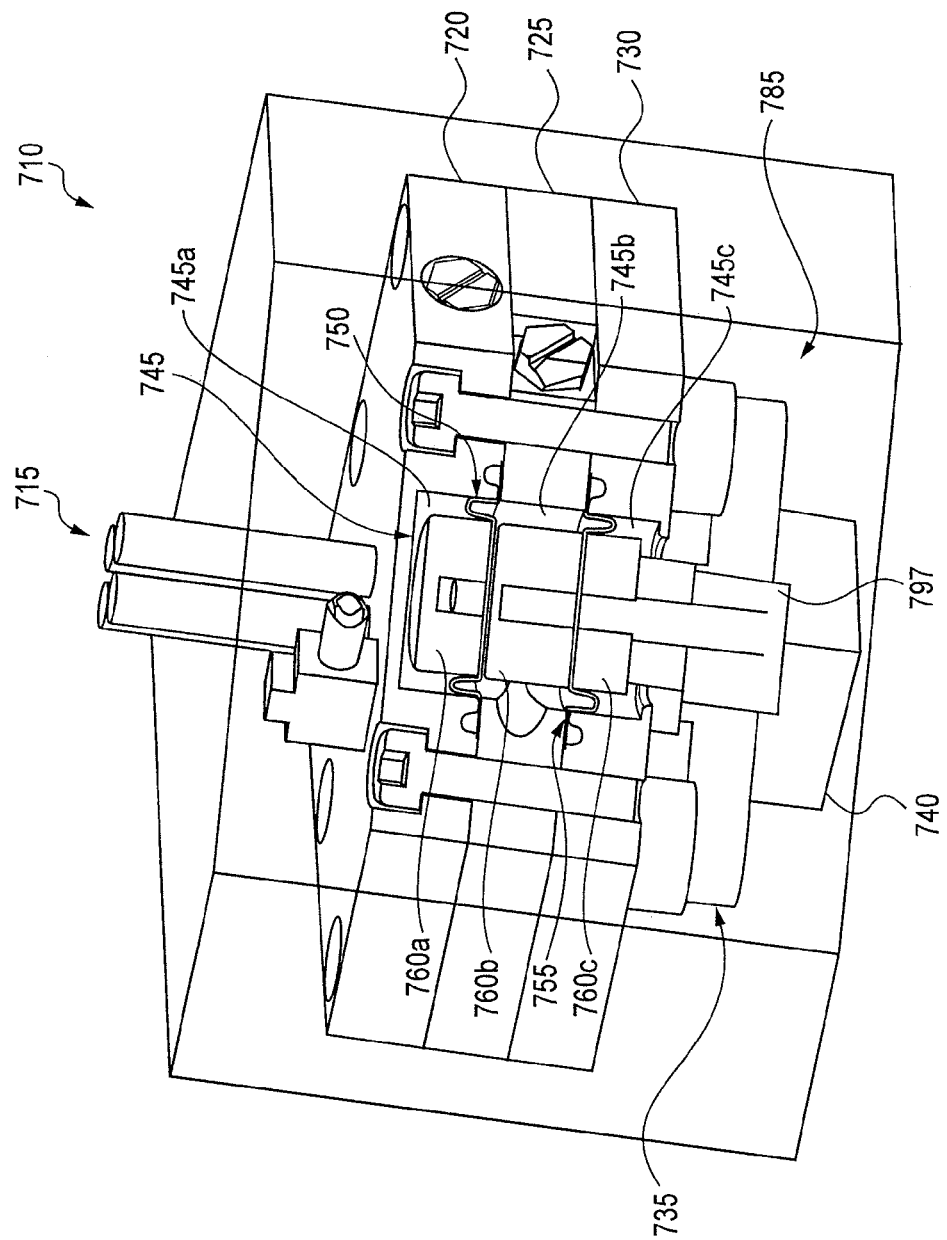
FIG. 12 shows a partial view of an alternative system according to aspects of the invention.
Figure 13:
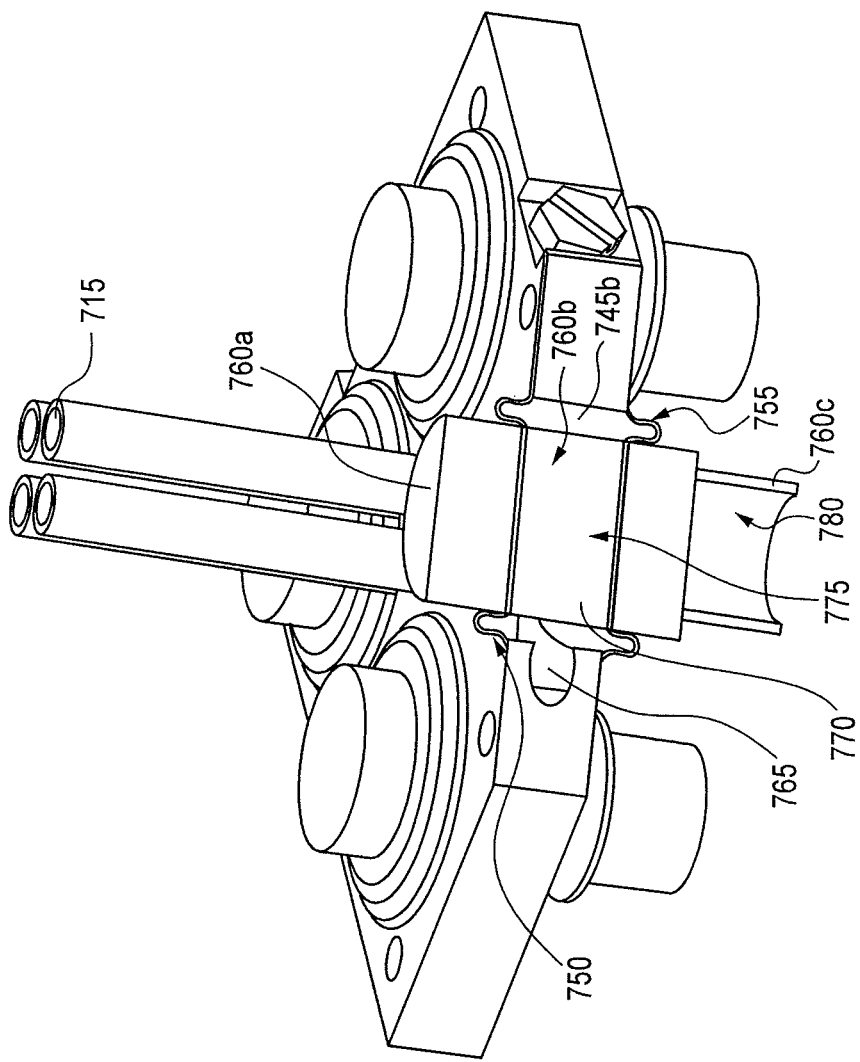
FIG. 13 shows another partial view of portions of the exemplary system shown in FIG. 12.
Figure 14:
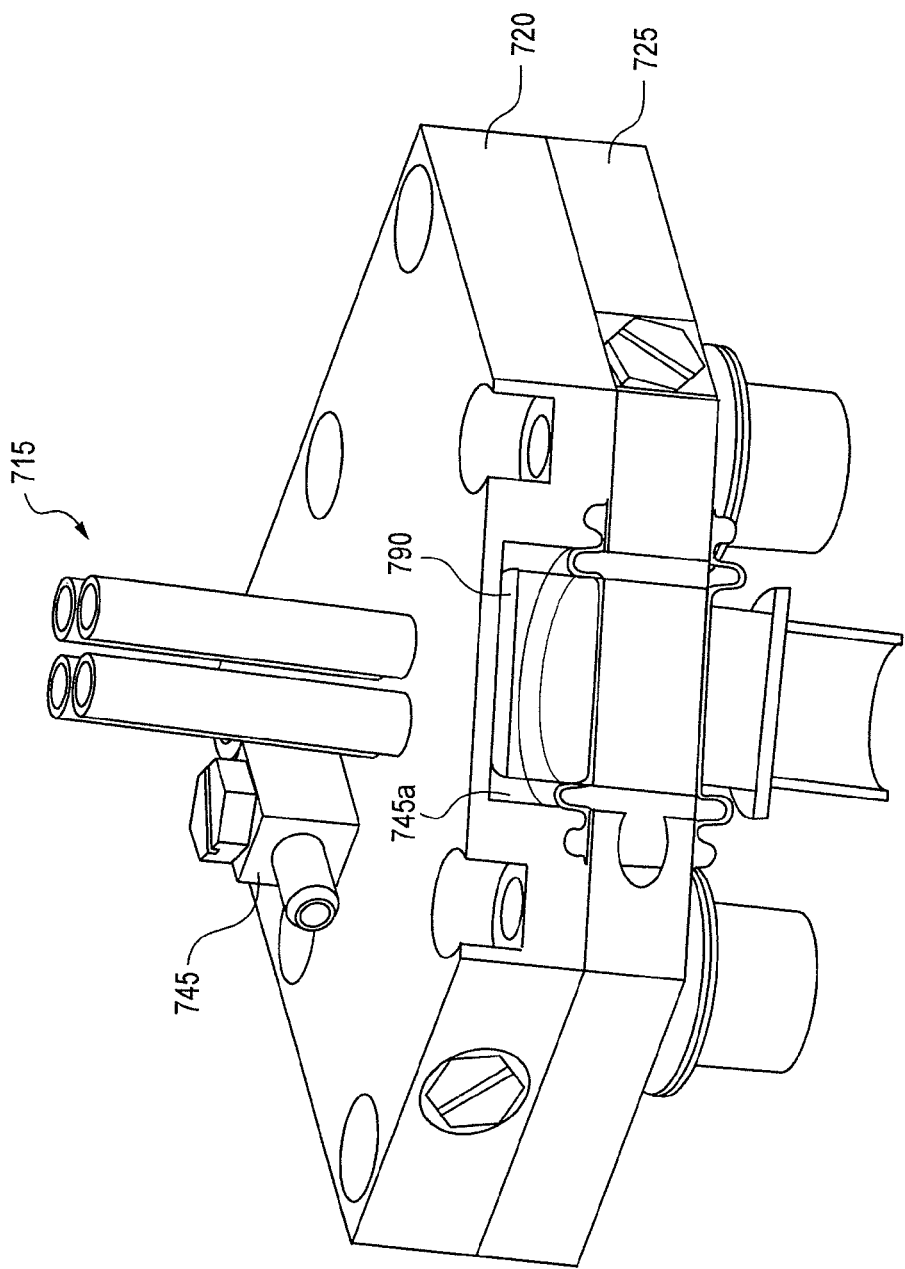
FIG. 14 shows another partial view of portions of the exemplary system shown in FIG. 12.

FIGS. 12-14 show partial views of an alternative system according to further aspects of the invention. The thermal chuck 710 shown in FIG. 12 includes four fluid conduits 715, instead of the six shown in FIG. 8. The four fluid conduits 715 may comprise, for example, a hot supply conduit, a hot return conduit, a cold supply conduit, and a cold return conduit. Alternatively, the four fluid conduits may comprise, for example, a hot supply conduit, a setpoint supply conduit, a cold supply conduit, and a single return conduit. The thermal chuck 710 further comprises a pneumatic manifold 720, fluid manifold 725, and bottom plate 730. Connected to the bottom plate 730 is another embodiment of a zero influence pusher 785 comprising at least a mixing chamber 735 and a heat sink 740.

Similar to the system shown in FIG. 8, the pneumatic manifold 720, fluid manifold 725, and bottom plate 730 comprise axially aligned bores that cooperate to form four respective chambers 745 symmetrically spaced about the coincident central axis of the thermal chuck 710 and zero influence pusher 785. Disposed in each chamber 745 is an upper rolling diaphragm 750 and a lower rolling diaphragm 755, which divide the chamber 745 into an upper chamber portion 745a, a middle chamber portion 745b, and a lower chamber portion 745c. An upper chamber element 760a is disposed in the upper chamber portion 745a. Also, a middle chamber element 760b is disposed in the middle chamber portion 745b. Additionally, a lower chamber element 760c is disposed in the lower chamber portion 745c.

As shown in FIG. 13, the fluid manifold 725 contains respective ports 765 that connect the respective fluid conduits 715 to respective middle chamber portions 745b. Each middle chamber element 760b has a cross bore 770 that intersects with an axial bore 775. The cross bore 770 is in fluid communication with the middle chamber portion 745b. The axial bore 775, in turn, communicates with a through bore 780 of the lower chamber element 760c. Furthermore, as seen in FIG. 12, the through bore 780 of each lower chamber element 760c is provided in fluid communication with the mixing chamber 735. In this manner, a fluid pathway is provided between each fluid conduit 715 and the heat sink 740.

Moreover, the diaphragms 750, 755 provide a floating connection of the zero influence pusher 785 to the thermal chuck 710. As such, the zero influence pusher 785 maintains six degree of freedom movement relative to the thermal chuck 710. Also, as further seen in FIG. 14, the pneumatic manifold 720 comprises pneumatic ports 790 that provide a pathway between pressure conduit 795 and the upper chamber portions 745a. Thus, similar to the system described above with respect to FIG. 8, the zero influence pusher 785 may be moved axially (i.e., in the z-axis direction) by appropriate application of pressure (or vacuum) to the pressure conduit 795.

Furthermore, similar to the system described above with respect to FIG. 8, the mixing chamber 735 and the heat sink 740 are selectively removable as a unit from the thermal chuck 710. For example, the mixing chamber 735 may be attached to the four respective lower chamber elements 760c by selectively disengageable connections 797, including but not limited to friction fit, snap fit, quick-disconnect, or any other suitable connections. In this manner, different heat sinks (having, for example, different thermal interface areas and/or different thermal interface materials) can be quickly and easily adapted to the system for use in testing different types of DUTs.

Thus, as can be seen form the description above, the zero influence pusher is not limited to use with any one specific thermal chuck. Rather, implementations of the invention may be used with any desired thermal control system in which it is desired to isolate the heat sink/DUT interface from external forces generated by the remainder of the system. In this way, the zero influence pusher substantially minimizes unwanted influence of the thermal controller structure to the interface between the heat sink and the DUT. Also, the zero influence pusher provides a six degree of freedom gimbaling of the heat sink to the DUT at the interface, thereby eliminating unbalanced force (e.g., torque) at the interface while also eliminating scrubbing (e.g., abrading) of the heat sink against the DUT. Furthermore, the pneumatically controlled axial movement of the zero influence pusher allows substantially jerk-free movement of the heat sink, and the uniform application of a force against the DUT.

Thermal Interface Material

Figure 15A:
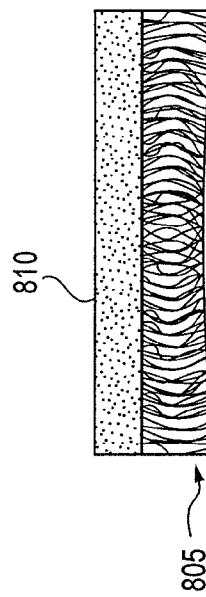
FIG. 15A shows an exemplary implementation of a thermal interface material according to aspects of the invention.
Figure 15B:
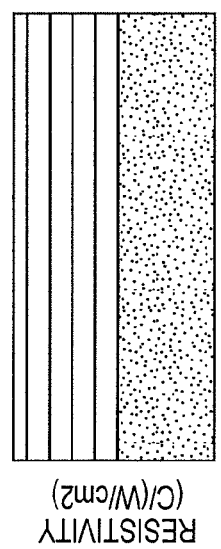
FIG. 15B shows a plot of the thermal resistivity of the thermal interface material of FIG. 14A.

FIG. 15A shows an exemplary embodiment of a thermal interface material comprising a plurality of nano tubes 805 according to aspects of the invention. In a preferred embodiment, the nano tubes 805 comprise carbon nano tubes grown on a substrate 810, although the invention is not limited to this type of nano tube. Because the nano tubes 805 are flexible, yet retain their thermal length when bent, the nano tubes 805 are capable of conforming to deviations in the surface of the DUT 815 (as shown in FIG. 15A) while providing a substantially uniform thermal resistivity across the surface of the DUT 815 (as shown in FIG. 15B). Accordingly, the nano tubes 805 minimize unwanted thermal gradients across the DUT 815.

In embodiments, the nano tubes 805 comprise approximately 150 μm height carbon nano tubes that are grown on a substrate 810. The substrate 810 may comprise, for example, a surface of a heat sink (e.g., heat sink 515 described above), such as a copper surface. Growing the carbon nano tubes directly on a surface of a heat sink provides a beneficial low thermal resistance. Alternatively the substrate 810 on which the nano tubes 805 are grown may be attached to a heat sink via re-workable thermal solder or thermal grease. In a preferred embodiment, the nano tubes 805 have a thermal resistivity of less than or equal to approximately 0.07 C/(W/cm$^2$) (where C is degrees Celsius, W is watts, and cm is centimeters) at operating pressures ranging from about 15 psi to about 75 psi (where psi is pounds per square inch), substantially no thermal mass, and can accommodate greater than 50 μm flatness. However, the invention is not limited to nano tubes having these specific properties, and other types of nano tubes may be used with the invention. For example, nano tubes having a height in the range of about 25 μm to about 50 μm are contemplated for use with the invention. Moreover, embodiments of the invention may utilize nano tubes that are either encapsulated or non-encapsulated.

Figure 16:
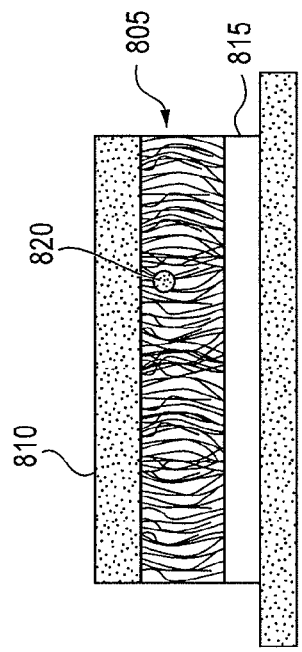
FIG. 16 shows an exemplary implementation of the thermal interface material according to aspects of the invention.
Figure 17:
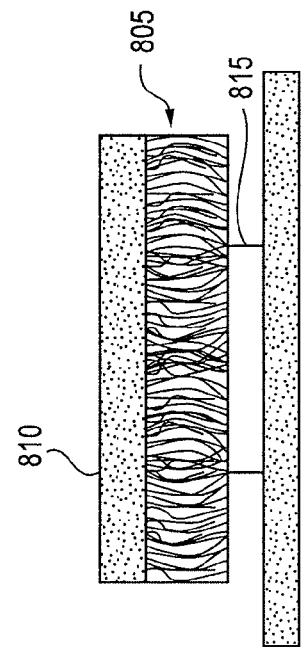
FIG. 17 shows another exemplary implementation of the thermal interface material according to aspects of the invention.

FIGS. 16 and 17 show further aspects of how the nano tubes 805 act as a flexible thermal interface material between the substrate 810 and DUT 815. For example, as depicted in FIG. 16, a particle 820 (e.g., debris) that is smaller in size than the length of the nano tubes 805 will not damage the substrate 810 and/or DUT 815. This is due to the fact that the nano tubes 805, which act as elongate thermal springs, may flex around the particle 820. Also, as shown in FIG. 17, a thermal interface material composed of a plurality of nano tubes 805 overlaps a relatively smaller DUT 815 without causing stress concentrations at the edges of the DUT 815. This minimizes possible damage to the DUT 815, while also avoiding thermal gradients due to stress concentrations.

FIG. 18 shows an embodiment in which hard stops 840 are provided on the substrate 810 amongst the nano tubes 805. Such hard stops 840 are employed, for example, when it is desired to transmit a force from the substrate 810 to the DUT 815, as is required under some testing conditions. The hard stops 840 are composed of any suitable material, and may be designed to any suitable size or dimension (e.g., length, width, and height), according to the intended use of the system. However, in a preferred embodiment, the hard stops 840 are shorter than the length of the uncompressed nano tubes 805, such that the nano tubes 805 must compress to some degree before the hard stops 840 engage the surface of the DUT 815. Such an arrangement ensures a uniform thermal interface between the substrate 810 and the DUT 815, while allowing a force (e.g., approximately 100 pounds) to be applied to the DUT 815.

FIG. 19 shows an embodiment in which hard stops 840 and vacuum channels 845 are provided at the substrate 810. The hard stops 840 function as discussed above with respect to FIG. 18. The vacuum channels 845 allow a negative pressure to be applied to the volume enclosed by the substrate 810, DUT 815, and hard stops 840. This provides a vacuum cup that allows the DUT 810 to be transported (e.g., moved) while still maintaining desired thermal properties and/or force application of the interface between the substrate 810 and DUT 815.

Figure 20:
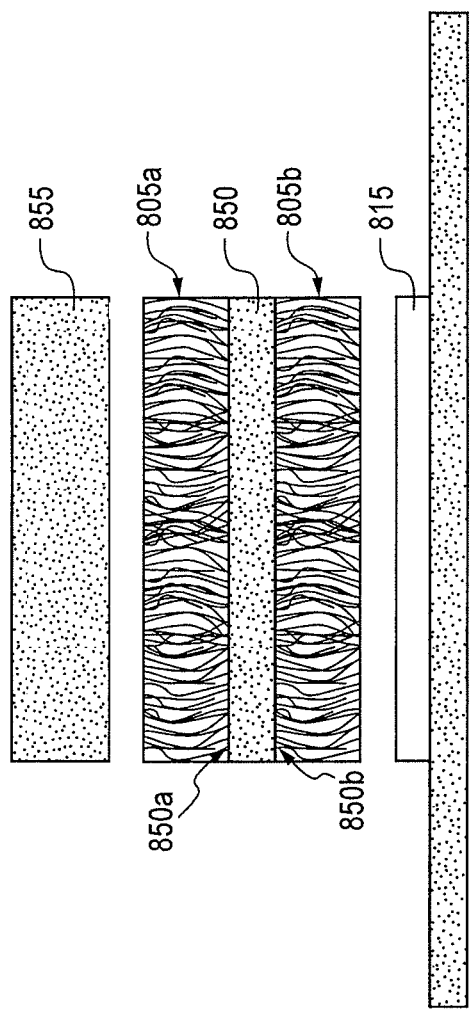
FIG. 20 shows another exemplary implementation of the thermal interface material according to aspects of the invention.

FIG. 20 shows another embodiment of the thermal interface material according to aspects of the invention. In this embodiment, the carbon nano tubes 805a, 805b are attached to a substrate 850 on an upper side 850a and a lower side 850b. The substrate 850 and carbon nano tubes 805 may be easily placed between a DUT 815 and a heat sink 855 without the use of thermal grease or other thermal interface materials. The substrate may comprise foil, such as, for example, copper foil on which the carbon nano tubes 805a, 805b are grown.

Moreover, the substrate 850 may have a thickness that allows the substrate 850 to be flexible. Such flexibility of the substrate 850 helps optimize conformance of the also flexible carbon nano tubes 805a, 805b to the surfaces of the DUT 815 and the heat sink 855.

As described herein, implementations of the invention comprising a thermal interface material of nano tubes provide a substantially uniform thermal interface that does not damage the DUT surface and can overlap the DUT edges without causing stress concentrations. Moreover, the thermal interface material comprising nano tubes according to aspects of the invention will not burn off or freeze like a thermal interface liquid, and can accommodate debris without damaging the DUT.

Except where otherwise indicated, all numbers expressing numerical values of properties (temperature, length, thermal resistivity, etc.) used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present invention. At the very least, and not to be considered as an attempt to limit the application of the doctrine of equivalents to the scope of the claims, each numerical parameter should be construed in light of the number of significant digits and ordinary rounding conventions.

Additionally, the recitation of numerical ranges within this specification is considered to be a disclosure of all numerical values and ranges within that range. For example, if a range is from about 1 to about 50, it is deemed to include, for example, 1, 7, 34, 46.1, 23.7, or any other value or range within the range.

Although the invention has been described with reference to several exemplary embodiments, which can be combined in any suitable manner, it is understood that the words that have been used are words of description and illustration, rather than words of limitation. Changes may be made within the purview of the appended claims, as presently stated and as amended, without departing from the scope and spirit of the invention in its aspects. Although the invention has been described with reference to particular means, materials and embodiments, the invention is not intended to be limited to the particulars disclosed. Rather, the invention extends to all functionally equivalent structures, methods and uses such as are within the scope of the appended claims.

What is claimed:

1. A thermal controller for controlling temperature of a device under test, comprising:
    a heat sink which is in thermal contact with a single device under test;
    a pusher having a free-floating gimbal attachment and attached to the heat sink; and
    a thermal chuck attached to the pusher,
    the thermal chuck comprising:
    a first plate;
    a pneumatic manifold attached to one surface of the first plate;
    a fluid manifold attached to one surface of the pneumatic manifold; and
    a second plate, one side of the second plate being attached to one surface of the fluid manifold and another side of the second plate being attached to the pusher,
    wherein a plurality of chambers spaced symmetrically about a longitudinal axis of the thermal chuck is provided through the pneumatic manifold, the fluid manifold and the second plate, a first diaphragm is provided in each of the plurality of chambers, to provide an upper chamber portion and a middle chamber portion in each of the plurality of chambers, a second diaphragm is provided in each of the plurality of chambers, to provide a lower chamber portion and the middle chamber portion in each of the plurality of chambers, the lower chamber portion being provided below the middle chambers portion the second diaphragm including a hole that allows fluid communication between the middle chamber portion and the lower chamber portion, the upper chamber portions of the plurality of chambers are connected to one another via pneumatic ports, the middle chamber portions of the plurality of chambers are connected to one another via fluid ports, and a fluid, for controlling a temperature of the s device, flowing from an intake, flows into the heat sink via the fluid ports and the fluid flowing in the heat sink flows into an outlet via the fluid ports, a chamber element applies a displacement of the first diaphragm to the pusher when a positive or negative pressure is supplied to the upper chamber portion of each of the plurality of chambers, the heat sink is operatively connected to the thermal chuck by the pusher in fluid communication with the plurality of chambers.

2. The thermal controller of claim 1, further comprising:

a first fluid source including a cold fluid having a first temperature;

a second fluid source including a setpoint fluid having a second temperature higher than the first temperature and same as a setpoint temperature of the single device;

a third fluid source including a hot fluid having a third temperature higher than the first and second temperatures;

a valve connected to the first fluid source, the second fluid source and the third fluid source, and which controls a flow rate of at least two of the cold fluid, the setpoint fluid and the hot fluid; and wherein a combined fluid having a combined temperature that directly affects a temperature of the heat sink is circulated through the heat sink.

3. The thermal controller of claim 1, wherein the chamber element includes an upper chamber element disposed within the upper chamber portion in each of the plurality of chambers, a middle chamber element disposed within the middle chamber portion in each of the plurality of chambers and a lower chamber element disposed within the lower chamber portion in each of the plurality of chambers, the lower chamber element in each of the plurality of chambers is connected to the pusher.

4. The thermal controller of 1, further comprising a thermal interface material made of carbon nano tubes disposed between, and contacting, the heat transfer element and the device.

5. The thermal controller of claim 4, further comprising a plurality of hard stops provided on the heat sink among the carbon nano tubes, wherein a length of the plurality of hard stops is smaller than a length of the carbon nano tubes and the plurality of hard stops are structured and arranged to transmit a force to the single device.

6. The thermal controller of claim 1, wherein the chamber element is provided in each of the plurality of chambers, and is connected to the pusher.

* * * * *